United States Patent
Lu et al.

(10) Patent No.: US 12,355,045 B2
(45) Date of Patent: Jul. 8, 2025

(54) LIQUID COOLING SYSTEM AND ENERGY STORAGE SYSTEM

(71) Applicant: XIAMEN KEHUA DIGITAL ENERGY TECH CO., LTD., Xiamen (CN)

(72) Inventors: Yijie Lu, Xiamen (CN); Xiaohang Zhao, Xiamen (CN); Jinxing Xv, Xiamen (CN); Yuanna Wang, Xiamen (CN)

(73) Assignee: XIAMEN KEHUA DIGITAL ENERGY TECH CO., LTD., Xiamen (CN)

( * ) Notice: Subject to any disclaimer, the term of this patent is extended or adjusted under 35 U.S.C. 154(b) by 233 days.

(21) Appl. No.: 18/091,396

(22) Filed: Dec. 30, 2022

(65) Prior Publication Data
US 2023/0387499 A1 Nov. 30, 2023

(51) Int. Cl.
*H01M 10/613* (2014.01)
*H01M 10/6552* (2014.01)
(Continued)

(52) U.S. Cl.
CPC ..... *H01M 10/6552* (2015.04); *H01M 10/613* (2015.04); *H01M 10/6568* (2015.04);
(Continued)

(58) Field of Classification Search
CPC .......... H05K 7/20781; H05K 7/20636; H05K 7/20645; H01M 10/615; H01M 10/6552
See application file for complete search history.

(56) References Cited

U.S. PATENT DOCUMENTS

| 3,749,981 | A | * | 7/1973 | Koltuniak | H02B 1/565 165/104.34 |
| 4,469,762 | A | * | 9/1984 | Singh | H01M 50/77 429/105 |

(Continued)

FOREIGN PATENT DOCUMENTS

| CN | 1209943 | A | * | 3/1999 |
| CN | 102791113 | A | * | 11/2012 |

(Continued)

OTHER PUBLICATIONS

Translation of CN213026257U named Translation-CN213026257U (Year: 2021).*

*Primary Examiner* — Paul Alvare

(57) ABSTRACT

A liquid cooling system for cooling heating units each having an identical cooling flow channel includes a cooling liquid circulating supply device which is provided with a liquid supply port and a liquid return port and a pipeline system which includes a liquid supply pipe, a liquid return pipe, and a flow distribution subsystem. One end of the liquid supply pipe communicates with the liquid supply port, and the other end is connected to the flow distribution subsystem at a total flow distribution end. One end of the liquid return pipe communicates with the liquid return port, and the other end is connected to the flow distribution subsystem at a total liquid collection end. The flow distribution subsystem connects the total flow distribution end and the liquid inlet of each heating unit and connects the total liquid collection end and the liquid outlet of each heating unit.

10 Claims, 3 Drawing Sheets

(51) Int. Cl.
  *H01M 10/6568* (2014.01)
  *H05K 7/20* (2006.01)
  *H01M 10/627* (2014.01)
  *H01M 10/647* (2014.01)

(52) U.S. Cl.
  CPC ....... *H05K 7/20645* (2013.01); *H01M 10/627* (2015.04); *H01M 10/647* (2015.04); *H05K 7/20636* (2013.01); *H05K 7/20781* (2013.01)

(56) References Cited

U.S. PATENT DOCUMENTS

| | | | | |
|---|---|---|---|---|
| 5,703,536 | A * | 12/1997 | Davis | H05K 7/20927 330/289 |
| 7,929,305 | B1 * | 4/2011 | Pal | H05K 7/20645 174/15.1 |
| 10,225,958 | B1 * | 3/2019 | Gao | H05K 7/20781 |
| 2002/0026904 | A1 * | 3/2002 | Maruyama | F24D 3/02 122/448.3 |
| 2011/0290448 | A1 * | 12/2011 | Campbell | H05K 7/20318 165/181 |
| 2016/0330873 | A1 * | 11/2016 | Farshchian | H05K 7/20663 |
| 2017/0200993 | A1 * | 7/2017 | Song | H01M 10/0525 |
| 2020/0161214 | A1 * | 5/2020 | Franz | F04D 29/528 |
| 2022/0045376 | A1 * | 2/2022 | Sakaray | H01M 10/6568 |

FOREIGN PATENT DOCUMENTS

| | | | | | |
|---|---|---|---|---|---|
| CN | 202797674 | U | * | 3/2013 | |
| CN | 206471447 | U | * | 9/2017 | |
| CN | 108199121 | A | * | 6/2018 | |
| CN | 213026257 | U | * | 4/2021 | |
| CN | 113301764 | A | * | 8/2021 | |
| CN | 215070123 | U | * | 12/2021 | |
| CN | 116646650 | A | * | 8/2023 | |
| JP | 2015040662 | A | * | 3/2015 | |
| WO | WO-2014086070 | A1 | * | 6/2015 | ......... H05K 7/20927 |

* cited by examiner

LIQUID COOLING SYSTEM AND ENERGY STORAGE SYSTEM

CROSS-REFERENCE TO RELATED APPLICATIONS

This application is based upon and claims priority to Chinese Patent Application No. 202210614545.6, filed on May 31, 2022, the entire contents of which are incorporated herein by reference.

TECHNICAL FIELD

The present disclosure relates to the technical field of heat dissipation, and specifically to a liquid cooling system and an energy storage system.

BACKGROUND

Heating units will inevitably produce heat during use. The temperature difference between a plurality of heating units significantly affects the service life of the heating units. In the prior art, air cooling, liquid cooling, or a combination of air cooling and liquid cooling is used to dissipate heat from the heating units. However, both air cooling and liquid cooling lead to inconsistent heat dissipation efficiency amongst the heating units because the heating units are arranged at different positions, resulting in a relatively large temperature difference between the heating units, namely, a poor temperature uniformity. When multiple heating units are used together, such a temperature difference will cause the heating units to have different service lives, which increases difficulties in maintenance. Particularly for a heat dissipation with liquid cooling, cooling liquids flowing through heating units have different flow rates and distinct flow resistances, as a result, the flow paths and the heat dissipation efficiency of the heating units are significantly different. A heating unit with high flow resistance (long pipeline path and small pipeline diameter) has a low flow rate and a low heat dissipation efficiency, while a heating unit with low flow resistance has a high flow rate and a high heat dissipation efficiency.

SUMMARY

The objective of the present disclosure is to overcome the above-mentioned defects or problems existing in the background and provides a liquid cooling system and an energy storage system, where a plurality of heating units have the same liquid passage length, so that the flow rates of the cooling liquids flowing through the heating units are consistent, thereby improving the temperature uniformity of the heating units.

In order to achieve the above objective, the following technical solutions are adopted:

The first technical solution relates to a liquid cooling system, which is used for cooling a plurality of heating units each having an identical cooling flow channel. The cooling flow channel is provided with a liquid inlet and a liquid outlet. The liquid cooling system includes: a cooling liquid circulating supply device provided with a liquid supply port and a liquid return port; and a pipeline system including a liquid supply pipe, a liquid return pipe, and a flow distribution subsystem. One end of the liquid supply pipe communicates with the liquid supply port, and the other end is connected to the flow distribution subsystem at a total flow distribution end. One end of the liquid return pipe communicates with the liquid return port, and the other end is connected to the flow distribution subsystem at a total liquid collection end. The flow distribution subsystem connects the total flow distribution end and the liquid inlet of each heating unit and connects the total liquid collection end and the liquid outlet of each heating unit. In the flow distribution subsystem, the plurality of heating units have the same liquid passage length. The liquid passage length of the heating unit is equal to the sum of the length of pipeline between the liquid inlet of the heating unit and the total flow distribution end and the length of pipeline between the liquid outlet of the heating unit and the total liquid collection end.

The second technical solution is based on the first technical solution. The total flow distribution end is located in a first plane, the total liquid collection end is located on a second plane parallel to the first plane, and the plurality of heating units are located between the first plane and the second plane. The flow distribution subsystem includes a first pipeline connecting the liquid inlet of each heating unit and the total flow distribution end and a second pipeline connecting the liquid outlet of each heating unit and the total liquid collection end. The first pipeline is only composed of a liquid distribution pipe located in the first plane, liquid distribution branch pipes extending along a first direction perpendicular to the first plane, and liquid inlet pipes. The liquid distribution pipe communicates with the total flow distribution end. The liquid distribution branch pipes are connected, in parallel, to the liquid distribution pipe, the liquid inlet pipes are connected, in parallel, to the liquid distribution branch pipe, and the liquid inlet pipes are arranged to correspond to the liquid inlets. The second pipeline is only composed of a liquid collection pipe located in the second plane, liquid collection branch pipes extending along the first direction, and liquid outlet pipes. The liquid collection pipe communicates with the total liquid collection end. The liquid collection branch pipes are connected, in parallel, to the liquid collection pipe, the liquid outlet pipes are connected, in parallel, to the liquid collection branch pipe, and the liquid outlet pipes are arranged to correspond to the liquid outlets.

The third technical solution is based on the second technical solution. At least a part of each heating unit is arranged along the first direction, and at least a part of each heating unit is arranged along a second direction. The second direction is parallel to the first plane and the second plane and perpendicular to the first direction. At least a part of the each liquid distribution branch pipe is arranged along the second direction, and at least a part of each liquid collection branch pipe is arranged along the second direction.

The fourth technical solution is based on the third technical solution. At least a part of the each heating unit is further arranged along a third direction. The third direction is perpendicular to the first direction and the second direction. At least a part of each liquid distribution branch pipe is further arranged along the third direction, and at least a part of each liquid collection branch pipe is further arranged along the third direction.

The fifth technical solution is based on the fourth technical solution. The first direction is the vertical direction, and the second plane is located above the first plane.

The sixth technical solution is based on the fifth technical solution. The liquid supply port and the liquid return port are located in a third plane perpendicular to the first direction. The third plane is located between the first plane and the second plane or at the same level as the first plane.

The seventh technical solution is based on the sixth technical solution. Each of the heating units extends along the third direction. The liquid inlet and the liquid outlet of the cooling flow channel are located at an end of the heating unit along the third direction. The heating units are arranged along the third direction to form two rows of heating assemblies, each row of heating assemblies is formed by a plurality of heating clusters arranged along the second direction, and each heating cluster is formed by a plurality of heating units arranged along the first direction. The liquid inlet and the liquid outlet of each heating unit in each row of heating assemblies have an extension direction opposite to that of the liquid inlet and the liquid outlet of each heating unit in the other row of heating assemblies. The liquid distribution branch pipes and the heating clusters are arranged in a one-to-one correspondence. The liquid collection branch pipes and the heating clusters are arranged in a one-to-one correspondence.

The eighth technical solution is based on the seventh technical solution. The cooling liquid circulating supply device is located on one side of the pipeline system along the second direction. The total flow distribution end and the total liquid collection end are respectively located at two ends of the pipeline system along the second direction. The liquid distribution pipe only includes a first segment, a second segment, and a third segment. The first segment and the third segment are parallel to each other and both extend in the second direction. The liquid distribution branch pipes are connected, in parallel, to the first segment and the third segment. The second segment extends along the third direction. Two ends of the second segment respectively communicates with the first segment and the third segment, and the second segment intersects with the liquid supply pipe at the total flow distribution end. The liquid collection pipe only includes a fourth segment, a fifth segment, and a sixth segment. The fourth segment and the sixth segment are parallel to each other and both extend in the second direction. The liquid collection branch pipes are connected, in parallel, to the fourth segment and the sixth segment. The fifth segment extends along the third direction. Two ends of the fifth segment respectively communicates with the fourth segment and the sixth segment, and the fifth segment intersects with the liquid return pipe at the total liquid collection end. The liquid return pipe includes a first connection segment extending along the second direction, a second connection segment extending along the first direction, and a third connection segment. One end of the first connection segment intersects with the fifth segment at the total liquid collection end, and the other end communicates with the top end of the second connection segment. The bottom end of the second connection segment communicates with the third connection segment. The other end of the third connection segment communicates with the liquid return port. The first connection segment is provided with an exhaust valve away from the total liquid collection end.

The ninth technical solution is based on the eighth technical solution. The liquid distribution branch pipe and the liquid collection branch pipe are located on two sides of a corresponding heating cluster along the second direction, respectively.

The tenth technical solution is based on the first to the ninth technical solutions. An energy storage system uses the liquid cooling system described in any of the first to the ninth technical solutions.

Compared with the prior art, the above technical solutions have the following advantages.

1. In the first technical solution, the plurality of heating units have the identical cooling flow channel and share the same liquid supply pipe and the same liquid return pipe, and all the heating units in the flow distribution subsystem have the same liquid passage length, that is, a liquid flow flowing out from the liquid supply port and returning to the liquid return port will have substantially the same path length regardless of which heating unit the liquid flow passes through. As a result, in practical applications, as long as the various pipes are designed to have the same dimension, the liquid flow is allowed to have the same flow rate in the cooling flow channel of each heating unit. In other words, the liquid flows in the cooling flow channels of the heating units have a uniform flow rate, balancing the temperature difference between the heating units, prolonging the service life of the heating units, and reducing the system cost.

2. In the second technical solution, the structures of the first pipeline and the second pipeline are simple and easy for implementation, which is convenient for the laying of the pipeline system and the setting of the heating unit. The liquid distribution branch pipe extends along the first direction, the liquid collection branch pipe extends along the first direction, the liquid distribution pipe is located in the first plane, and the liquid collection pipe is located in the second plane. The layout is reasonable, concise, and attractive. Moreover, this layout is beneficial to ensure the heating units to have the same liquid passage length.

3. In the third technical solution, at least a part of each heating unit is arranged along the first direction, and at least a part of each heating unit is arranged along the second direction. That is, the heating units are partially arranged in a rectangular array. At least a part of each liquid distribution branch pipe is arranged along the second direction, and at least a part of each liquid collection branch pipe is arranged along the second direction. That is, the way that the liquid distribution branch pipes are arranged and the way that the liquid collection branch pipes are arranged correspond to the way that the heating units are arranged. This configuration is convenient to realize the same liquid passage length of the heating units by simply designing the structures of the liquid distribution pipe and the liquid collection pipe.

4. In the fourth technical solution, at least a part of each heating unit is arranged along the third direction. That is, the heating units are arranged in an array in a three-dimensional direction. At least a part of each liquid distribution branch pipe is further arranged along the third direction, and at least a part of each liquid collection branch pipe is further arranged along the third direction. That is, the way that the liquid distribution branch pipes are arranged and the way that the liquid collection branch pipes are arranged correspond to the way that the heating units are arranged. At this time, the same liquid passage length of the heating units is ensured by adjusting the structures of the liquid collection pipe and the liquid distribution pipe.

5. In the fifth technical solution, the first direction is the vertical direction, and the second plane is located above the first plane. That is, the liquid distribution pipe is at the bottom, and the liquid collection pipe is at the top. In practical applications, a pipeline located at the top is easily affected by solar radiation and heat rose from a heating unit below to have a relatively high temperature. By using the present technical solution, the liquid distribution pipe communicating with the liquid supply port is less affected by solar radiation and the heat rose from the heating unit below, which ensures that the cooling liquid flowing into the liquid inlet of the heating unit has a relatively low temperature, thereby ensuring the heat dissipation efficiency. Furthermore, this structure configuration can also ensure that the cooling flow channel of each heating unit is filled with liquid, thereby ensuring the heat dissipation of the heating unit. In addition, the arrangement of the liquid collection pipe at the top facilitates the discharge of air bubbles in the pipelines.

6. In the sixth technical solution, the liquid supply port and the liquid return port are located in the third plane, that is, the liquid supply port and the liquid return port are located in the same plane. Since the third plane is below the second plane, the liquid flow flowing out from the liquid outlet of the heating unit and reaching the liquid collection pipe will definitely return to the liquid return port under the action of gravity, thereby reducing the work of a pump.

7. In the seventh technical solution, two rows of heating assemblies are arranged. The liquid inlet and the liquid outlet of each heating unit in each row of heating assemblies have an extension direction opposite to that of the liquid inlet and the liquid outlet of each heating unit in the other row of heating assemblies. The liquid distribution branch pipes and the heating clusters are arranged in a one-to-one correspondence, and the liquid collection branch pipes and the heating clusters are arranged in a one-to-one correspondence, which facilitates the connection between the liquid inlet pipe and the liquid inlet of the heating unit and the connection between the liquid outlet pipe and the liquid outlet of the heating unit. When the heating unit needs maintenance, the heating unit can be removed. In addition, this arrangement ensures the heating units to have the same liquid passage length.

8. In the eighth technical solution, the cooling liquid circulating supply device is located on one side of the pipeline system along the second direction, that is, the liquid supply port and the liquid return port are located on the same side, which facilitates the integration of the cooling liquid circulating supply device and is conducive to transportation and maintenance in practical applications. The liquid distribution pipe and the liquid collection pipe have a concise and attractive structure and involve a simple production process, thereby reducing the cost. The liquid return pipe has a succinct and clear structure and involves a simple production process and a low cost. Since the liquid collection pipe is located at the top, after the liquid collection branch pipes are connected, in parallel, on the liquid collection pipe, air bubbles in the liquid flow of each branch will flow upward. The exhaust valve is arranged on the first connection segment away from the total liquid collection end, which facilitates the discharge of air bubbles of liquid in each branch, thereby further reducing the cost. The arrangement of the second connection segment ensures the liquid to enter the liquid return port after falling down under the action of gravity, thereby reducing the work of a pump. In addition, the above structural design ensures the heating units to have the same liquid passage length.

9. In the ninth technical solution, the liquid distribution branch pipe and the liquid collection branch pipe are located on two sides of the corresponding heating cluster along the second direction. This configuration facilitates the connection between the liquid inlet pipe and the liquid inlet of the heating unit and the connection between the liquid outlet pipe and the liquid outlet of the heating unit. Furthermore, compared with the structure where the liquid distribution branch pipe and the liquid collection branch pipe are located on the same side of the heating cluster, the structure of the present technical solution avoids the heat flow between the liquid distribution branch pipe and the liquid collection branch pipe and is more attractive.

10. In the tenth technical solution, the liquid cooling system in any of the first to the ninth technical solutions is used. The temperature difference of the heating units is relatively uniform, which prolongs the service life of the heating units and reduces the system cost.

BRIEF DESCRIPTION OF THE DRAWINGS

In order to illustrate the technical solutions of the embodiments more clearly, the accompanying drawings that need to be used are briefly introduced below.

Figure 1:
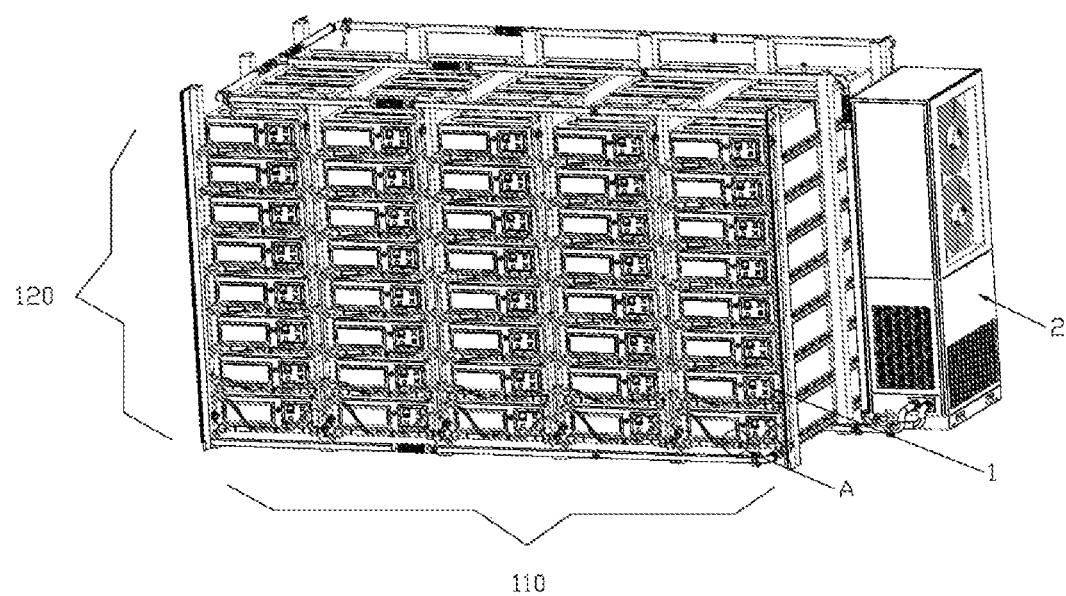
FIG. 1 is a perspective view of the liquid cooling system in an embodiment.

Description of main reference signs: liquid cooling system 100; heating unit 1; liquid inlet 11; liquid outlet 12; cooling liquid circulating supply device 2; liquid supply port 21; liquid return port 22; liquid supply pipe 3; liquid return pipe 4; first connection segment 41; exhaust valve 411; second connection segment 42; third connection segment 43; flow distribution subsystem 5; total flow distribution end 01; total liquid collection end 02; liquid distribution pipe 51; first segment 511; second segment 512; third segment 513; the liquid distribution branch pipe 52; liquid inlet pipe 53; liquid collection pipe 54; fourth segment 541; fifth segment 542; sixth segment 543; liquid collection branch pipe 55; liquid outlet pipe 56; heating assembly 110; heating cluster 120.

DETAILED DESCRIPTION OF THE EMBODIMENTS

In the claims and the specification, unless otherwise defined, the terms "first", "second", or "third", etc. are used to distinguish different objects, rather than to describe a specific order.

In the claims and the specification, unless otherwise defined, orientational or positional relationships indicated by the terms "center", "lateral", "longitudinal", "horizontal", "vertical", "top", "bottom", "inner", "outer", "upper", "lower", "front", "rear", "left", "right", "clockwise", "counterclockwise", etc. are based on the orientational and positional relationships shown in the drawings, which is only for the purpose of simplifying the description and does not imply that the device or element referred to must have a particular orientation or be constructed and operated in a particular orientation.

In the claims and the specification, unless otherwise defined, the term "fixed connection" or "fixedly connected" should be understood in a broad sense, that is, any connection mode without displacement relationship and relative rotation relationship between the two, namely, including non-removably fixed connection, removably fixed connection, integrated connection, and fixed connection by other devices or elements.

In the claims and the specification, unless otherwise defined, the terms "including", "having", and their variants mean "including but not limited to".

The technical solutions in the embodiments will be clearly and completely described below with reference to the accompanying drawings.

Figure 2:
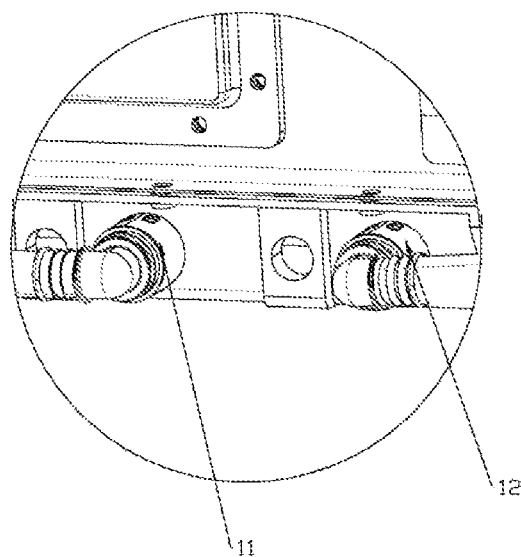
FIG. 2 is an enlarged view of part A part in FIG. 1.
Figure 3:
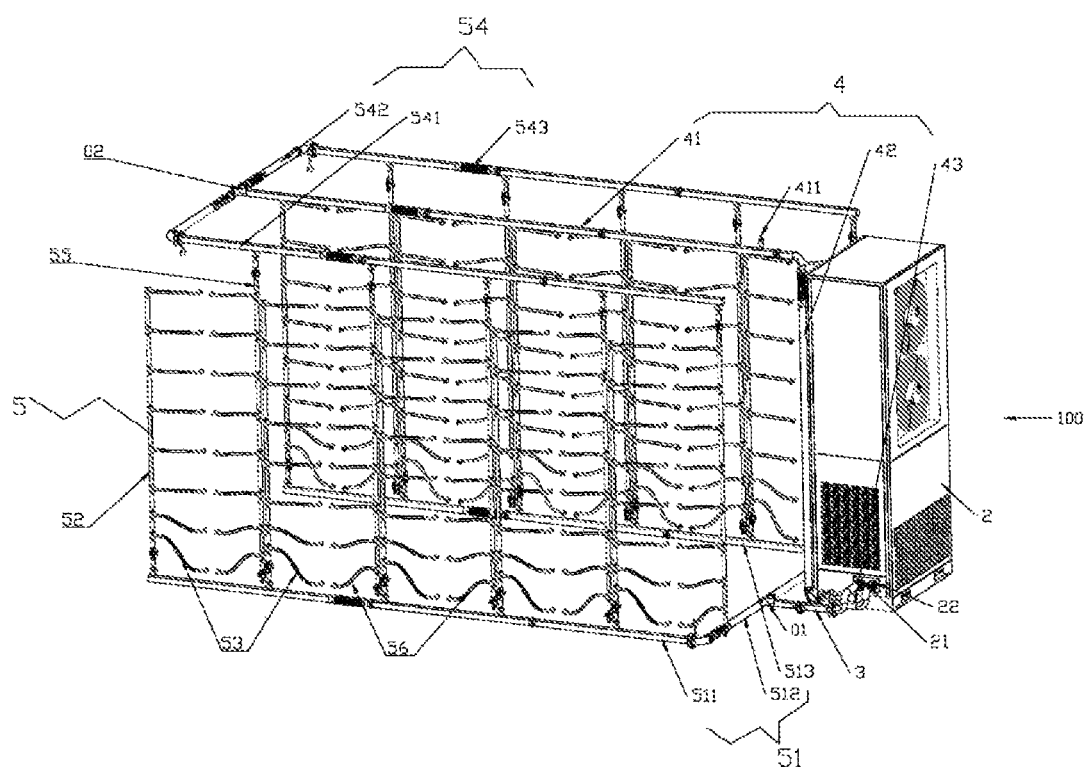
FIG. 3 is an exploded view showing the structure of the pipeline system in an embodiment.

Referring to FIGS. 1-3, FIGS. 1-3 show the liquid cooling system 100 of the present embodiment, which is used for cooling several heating units 1 each having an identical cooling flow channel. The cooling flow channel is provided with the liquid inlet 11 and the liquid outlet 12. The liquid cooling system 100 includes the cooling liquid circulating supply device 2 and a pipeline system.

The cooling liquid circulating supply device 2 is provided with the liquid supply port 21 and the liquid return port 22. The pipeline system includes the liquid supply pipe 3, the liquid return pipe 4, and the flow distribution subsystem 5. One end of the liquid supply pipe 3 communicates with the liquid supply port 21, and the other end communicates with the flow distribution subsystem 5 at the total flow distribution end 01. One end of the liquid return pipe 4 communicates with the liquid return port 22, and the other end communicates with the flow distribution subsystem 5 at the total liquid collection end 02. The flow distribution subsystem 5 is used to connect the total flow distribution end 01 and the liquid inlet 11 of each heating unit 1 and connect the total liquid collection end 02 and the liquid outlet 12 of each heating unit 1. In the flow distribution subsystem 5, the plurality of heating units 1 have the same liquid passage length. The liquid passage length of the heating unit 1 is equal to the sum of the length of pipeline between the liquid inlet 11 of the heating unit 1 and the total flow distribution end 01 and the length of pipeline between the liquid outlet 12 of the heating unit 1 and the total liquid collection end 02.

Specifically, at least a part of each heating unit 1 is arranged along a first direction, at least a part of each heating unit 1 is arranged along a second direction, and at least a part of each heating unit 1 is arranged along a third direction, that is, the heating units 1 are arranged in a three-dimensional array. The first direction, the second direction, and the third direction are orthogonal. In FIGS. 1 and 3, the first direction is the vertical direction, the second direction is the left-right direction, and the third direction is the front-rear direction. In a specific implementation, each heating unit 1 extends along the third direction, and the liquid inlet 11 and the liquid outlet 12 of the cooling flow channel thereof are located at one end of the heating unit 1 along the third direction, in other words, the liquid inlet 11 and the liquid outlet 12 of the cooling flow channel are located at the front end or the rear end of the heating unit 1. Referring to FIG. 2, the liquid inlet 11 and the liquid outlet 12 of the cooling flow channel are located in the middle of the heating unit 1.

Referring to FIG. 1, the heating units 1 are arranged along the third direction to form two rows of heating assemblies 110, each row of heating assemblies 110 is formed by a plurality of heating clusters 120 arranged along the second direction, and each heating cluster 120 is formed by a plurality of heating units 1 arranged along the first direction. The liquid inlet 11 and the liquid outlet 12 of each heating unit 1 in each row of heating assemblies 110 have an extension direction opposite to that of the liquid inlet 11 and the liquid outlet 12 of each heating unit 1 in the other row of heating assemblies 110. In practical applications, the heating units 1 can be installed in a rack or a cabinet, the rack or the cabinet is provided with a plurality of installation channels along the vertical direction, and the heating units 1 are correspondingly installed in the installation channels. The pipeline system is laid on the rack or the cabinet. In the present embodiment, the each heating unit 1 is a battery module with a liquid cooling plate, and the cooling flow channel is arranged in the liquid cooling plate. However, it should be understood that the heating units may also be other electrical modules.

Referring to FIG. 3, the cooling liquid circulating supply device 2 is provided with the liquid supply port 21 and the liquid return port 22. In a specific implementation, the cooling liquid circulating supply device 2 is located on one side of the pipeline system along the second direction. In FIG. 3, the cooling liquid circulating supply device 2 is located on the right side of the pipeline system, and the liquid supply port 21 and the liquid return port 22 are located in the third plane parallel to the horizontal plane. The design that the liquid supply port 21 and the liquid return port 22 are located on the same side facilitates the integration of the cooling liquid circulating supply device 2, which is more conducive to transportation and maintenance in practical applications. In the present embodiment, the cooling liquid circulating supply device 2 is generally provided with a driving component, such as a circulating pump, to drive the cooling liquid to flow, which belongs to the prior art and will not be repeated in the present embodiment.

In a specific implementation, the total flow distribution end 01 is located in the first plane, the total liquid collection end 02 is located on the second plane parallel to the first plane, and the heating units 1 are located between the first plane and the second plane. The first plane and the second plane are both perpendicular to the first direction, that is, the first plane and the second plane are both horizontal planes. In the present embodiment, the second plane is parallel to and above the first plane, and the third plane is located between the first plane and the second plane. However, it should be understood that the third plane may also be located in the first plane.

In a specific implementation, the flow distribution subsystem 5 further includes a first pipeline connecting the liquid inlet 11 of each heating unit 1 and the total flow distribution end 01 and a second pipeline connecting the liquid outlet 12 of each heating unit 1 and the total liquid collection end 02.

Specifically, the first pipeline is only composed of the liquid distribution pipe 51 located in the first plane (that is, the liquid distribution pipe 51 is located at the bottom), the liquid distribution branch pipe 52 extending along the first direction, and the liquid inlet pipe 53. The liquid distribution pipe 51 communicates with the total flow distribution end 01. Liquid distribution branch pipes 52 are connected, in parallel, to the liquid distribution pipe 51, liquid inlet pipes 53 are connected, in parallel, to the liquid distribution branch pipe 52, and the liquid inlet pipes 53 are arranged to correspond to the liquid inlets 11.

In the present embodiment, the liquid distribution pipe 51 only includes the first segment 511, the second segment 512, and the third segment 513. The first segment 511 and the third segment 513 are parallel to each other and both extend in the second direction. The liquid distribution branch pipes 52 are connected, in parallel, to the first segment 511 and the third segment 513. The second segment 512 extends along the third direction. Two ends of the second segment 512 respectively communicates with the first segment 511 and the third segment 513, and the middle of the second segment 512 intersects with the liquid supply pipe 3 at the total flow distribution end 01. The liquid distribution pipe 51 has a succinct and attractive structure and involves a simple production process, thereby reducing the cost.

At least a part of each liquid distribution branch pipe 52 is arranged along the second direction, and at least a part of each liquid distribution branch pipe 52 is arranged along the third direction. The liquid distribution branch pipes 52 and the heating clusters 120 arranged in a one-to-one correspondence. In other words, the way that the liquid distribution branch pipes 52 are arranged corresponds to the way that the heating units 1 are arranged. In the present embodiment, the liquid distribution branch pipes 52 are configured in two rows, with one row at the front end of the front row of heating assemblies 110 and the other row at the rear end of the rear row of heating assemblies 110.

In the present embodiment, the lengths of the liquid inlet pipes 53 are equal.

The second pipeline is only composed of the liquid collection pipe 54 located in the second plane (that is, the liquid collection pipe 54 is located at the top), liquid collection branch pipes 55 extending along the first direction, and liquid outlet pipes 56. The liquid collection pipe 54 communicates with the total liquid collection end 02. The liquid collection branch pipes 55 are connected, in parallel, to the liquid collection pipe 54, the liquid outlet pipes 56 are connected, in parallel, to the liquid collection branch pipe 55, and the liquid outlet pipes 56 are arranged to correspond to the liquid outlets 12.

Specifically, the liquid collection pipe 54 only includes the fourth segment 541, the fifth segment 542, and the sixth segment 543. The fourth segment 541 and the sixth segment 543 are parallel to each other and both extend in the second direction. The liquid collection branch pipes 55 are connected, in parallel, to the fourth segment 541 and the sixth segment 543. The fifth segment 542 extends along the third direction. Two ends of the fifth segment 542 respectively communicates with the fourth segment 541 and the sixth segment 543, and the middle of the fifth segment 542 intersects with the liquid return pipe 4 at the total liquid collection end 02. The liquid collection pipe 54 has a succinct and attractive structure and involves a simple production process, thereby reducing the cost. In practical applications, a pipeline located at the top is easily affected by solar radiation and heat rose from a heating unit 1 below to have a relatively high temperature, thus the structure design in which the liquid distribution pipe 51 is at the bottom and the liquid collection pipe 54 is at the top is adopted. The liquid distribution pipe 51 communicating with the liquid supply port 21 is less affected by solar radiation and the heat rose from the heating unit 1 below, which ensures that the cooling liquid flowing into the liquid inlet 11 of the heating unit 1 has a relatively low temperature, thereby ensuring the heat dissipation efficiency. Furthermore, this structure configuration can also ensure that the cooling flow channel of each heating unit 1 is filled with liquid, thereby ensuring the heat dissipation of the heating unit 1. Since the liquid collection pipe 54 is located at the top, after the liquid collection branch pipes 55 are connected, in parallel, to the liquid collection pipe 54, air bubbles in the liquid flow of each branch will flow upward, thus facilitating the discharge of air bubbles in the pipelines.

At least a part of the each liquid collection branch pipe 55 is arranged along the second direction, and at least a part of the each liquid collection branch pipe 55 is arranged along the third direction. The liquid collection branch pipes 55 and the heating clusters 120 are arranged in a one-to-one correspondence. In other words, the way that the liquid collection branch pipes 55 are arranged corresponds to the way that the heating units 1 are arranged. In the present embodiment, the liquid collection branch pipes 55 are configured in two rows, with one row at the front end of the front row of heating assemblies 110 and the other row at the rear end of the rear row of heating assemblies 110.

In the present embodiment, the lengths of the liquid outlet pipes 56 are equal.

In the present embodiment, the total flow distribution end and the total liquid collection end 02 are located at two ends of the pipeline system along the second direction, respectively.

In a specific implementation, the liquid return pipe 4 includes the first connection segment 41 extending along the second direction, the second connection segment 42 extending along the first direction, and the third connection segment 43. One end of the first connection segment 41 intersects with the middle of the fifth segment 542 at the total liquid collection end 02, and the other end communicates with the top end of the second connection segment 42. The bottom end of the second connection segment 42 communicates with the third connection segment 43. The other end of the third connection segment 43 communicates with the liquid return port 22. The first connection segment 41 is provided with the exhaust valve 411 away from the total liquid collection end 02. The liquid return pipe 4 has a concise and clear structure and involves a simple production process and a low cost. The exhaust valve 411 arranged on the first connection segment 41 away from the total liquid collection end 02 can discharge the air bubbles of the liquid in each branch, thus further reducing the cost. The arrangement of the second connection segment 42 ensures that liquids enter the liquid return port 22 after falling down under the action of gravity, thereby reducing the work of a pump.

In the present embodiment, the liquid distribution branch pipe 52 and the liquid collection branch pipe 55 are located on two sides of the corresponding heating cluster 120 along the second direction. This configuration facilitates the connection between the liquid inlet pipe 53 and the liquid inlet 11 of the heating unit 1 and the connection between the liquid outlet pipe 56 and the liquid outlet 12 of the heating unit 1. Furthermore, compared with the structure where the liquid distribution branch pipe 52 and the liquid collection branch pipe 55 are located on the same side of the heating cluster 120, this configuration avoids the heat flow between the liquid distribution branch pipe 52 and the liquid collection branch pipe 55 and is more attractive.

It should be understood that in practical applications, the sizes and quantities of elbows, three-way components, valves, etc. in the pipeline system are the same, and the dimensions of the pipes are the same.

In a specific implementation, the cooling liquid circulating supply device 2 provides a liquid flow which flows from the liquid supply port 21, passes through the liquid supply pipe 3, and is distributed at the total flow distribution end 01. A part of the liquid flow passes through the second segment 512 of the liquid distribution pipe 51 and reaches the first segment 511 of the liquid distribution pipe 51. A part of the liquid flow passes through the second segment 512 of the liquid distribution pipe 51 and reaches the third segment 513 of the liquid distribution pipe 51. The liquid flow reaching the first segment 511 flows upward to enter the liquid distribution branch pipe 52, passes through the liquid inlet pipe 53, enters the cooling flow channel, and then enters the liquid collection branch pipe 55 via the liquid outlet pipe 56. Subsequently, the liquid flow continues to flow upward into the fourth segment 541 or the sixth segment 543 of the liquid collection pipe 54, passes through the fifth segment 542, and reaches the total liquid collection end 02. Next, the liquid flow enters the first connection segment 41 of the liquid return pipe 4, passes through the exhaust valve 411, and reaches the second connection segment 42. Under the action of gravity, the liquid flow flows from the second connection segment 42 to the third connection segment 43 at the bottom and finally returns to the cooling liquid circulating supply device 2 via the liquid return port 22. The above goes in circles.

Therefore, in the present technical solution, the heating units 1 have identical cooling flow channel and share the same liquid supply pipe 3 and the same liquid return pipe 4, and all the heating units 1 in the flow distribution subsystem 5 have the same liquid passage length, that is, a liquid flow flowing out from the liquid supply port 21 and returning to the liquid return port 22 will have substantially the same path length regardless of which heating unit 1 the liquid flow passes through. As a result, in practical applications, as long as the pipes are designed to have the same dimension, the liquid flow is allowed to have the same flow rate in the cooling flow channel of each heating unit 1. In other words, the liquid flows in the cooling flow channels of the heating units 1 have a uniform flow rate, minimizing the temperature difference of the heating units 1, prolonging the service life of the heating units 1, and reducing the system cost. Specifically, the structures of the first pipeline and the second pipeline are simple and easy for implementation, which is convenient for the laying of the pipeline system and the setting of the heating unit 1. The liquid distribution branch pipe 52 extends along the first direction, the liquid collection branch pipe 55 extends along the first direction, the liquid distribution pipe 51 is located in the first plane, and the liquid collection pipe 54 is located in the second plane. The layout is reasonable, concise, and attractive. Moreover, this layout is beneficial to ensure the heating units 1 to have the same liquid passage length by adjusting the structures of the liquid collection pipe 54 and the liquid distribution pipe 51.

In the present embodiment, the heating unit 1 is arranged to correspond to the pipeline system, which facilitates the connection between the liquid inlet pipe 53 and the liquid inlet 11 of the heating unit 1 and the connection between the liquid outlet pipe 56 and the liquid outlet 12 of the heating unit 1. When the heating unit 1 needs maintenance, the heating unit 1 can be removed. In addition, this arrangement ensures the heating units to have the same liquid passage length.

The present disclosure also provides an energy storage system (not shown in the figure), which uses the liquid cooling system 100 in the above-mentioned embodiments. It is obvious that the temperature difference of the heating units 1 in the energy storage system is relatively uniform, which prolongs the service life of the heating units 1 and reduces the system cost.

The descriptions of the above specification and embodiments are used to explain the protection scope of the present application, but do not constitute a limitation on the protection scope of the present application.

What is claimed is:

1. A liquid cooling system for cooling a plurality of heating units each having an identical cooling flow channel provided with a liquid inlet and a liquid outlet; wherein the liquid cooling system comprises:
   a cooling liquid circulating supply device provided with a liquid supply port and a liquid return port; and
   a pipeline system including a liquid supply pipe, a liquid return pipe, and a flow distribution subsystem; one end of the liquid supply pipe communicates with the liquid supply port, and the other end is connected to the flow distribution subsystem at a total flow distribution end; one end of the liquid return pipe communicates with the liquid return port, and the other end is connected to the flow distribution subsystem at a total liquid collection end; the flow distribution subsystem connects the total flow distribution end and the liquid inlet of each heating unit and connects the total liquid collection end and the liquid outlet of each heating unit; in the flow distribution subsystem, the plurality of heating units have the same liquid passage length; the liquid passage length of the heating unit is equal to the sum of the length of pipeline between the liquid inlet of the heating unit and the total flow distribution end and the length of pipeline between the liquid outlet of the heating unit and the total liquid collection end;
   wherein the cooling liquid circulating supply device is located on one side of the pipeline system along a length direction; the total flow distribution end and the total liquid collection end are respectively located at two ends of the pipeline system along the length direction;
   the flow distribution subsystem comprises a first pipeline connecting the liquid inlet of each heating unit and the total flow distribution end, and a second pipeline connecting the liquid outlet of each heating unit and the total liquid collection end; the first pipeline comprises a liquid distribution pipe located in the first plane, liquid distribution branch pipes extending along a height direction perpendicular to the first plane, and liquid inlet pipes; the second pipeline comprises a liquid collection pipe located in the second plane, liquid collection branch pipes extending along the height direction, and liquid outlet pipes;
   the liquid distribution pipe consists of a first segment, a second segment, and a third segment; the first segment and the third segment are parallel to each other and both extend in the length direction, the liquid distribution branch pipes are connected, in parallel, to the first segment and the third segment; the second segment extends along a width direction, two ends of the second segment respectively communicates with the first segment and the third segment, and the second segment intersects with the liquid supply pipe at the total flow distribution end;
   the liquid collection pipe consists of a fourth segment, a fifth segment, and a sixth segment; the fourth segment and the sixth segment are parallel to each other and both extend in the length direction, the liquid collection branch pipes are connected, in parallel, on the fourth segment and the sixth segment; the fifth segment extends along the width direction, two ends of the fifth segment respectively communicates with the fourth segment and the sixth segment, and the fifth segment intersects with the liquid return pipe at the total liquid collection end.

2. The liquid cooling system according to claim 1, wherein the total flow distribution end is located in a first plane, the total liquid collection end is located on a second plane parallel to the first plane, and the plurality of heating units are located between the first plane and the second plane;
   the liquid distribution pipe communicates with the total flow distribution end, the liquid distribution branch pipes are connected to the liquid distribution pipe and the liquid distribution branch pipes are parallel to each other, a plurality of liquid inlet pipes are connected to each liquid distribution branch pipe and the plurality of liquid inlet pipes are parallel to each other, and the liquid inlet pipes are arranged to correspond to the liquid inlets;
   the liquid collection pipe communicates with the total liquid collection end, the liquid collection branch pipes are connected to the liquid collection pipe and the liquid collection branch pipes are parallel to each other, a plurality of liquid outlet pipes are connected to each liquid collection branch pipe and the plurality of liquid outlet pipes are parallel to each other, and the liquid outlet pipes are arranged to correspond to the liquid outlets.

3. The liquid cooling system according to claim 2, wherein at least a part of the heating units are distributed along the height direction, and at least a part of the heating units are distributed along the length direction, the length direction is parallel to the first plane and the second plane and is perpendicular to the height direction; at least a part of the liquid distribution branch pipes are distributed along the length direction, and at least a part of the liquid collection branch pipes are distributed along the length direction.

4. The liquid cooling system according to claim 3, wherein at least a part of the heating units are further distributed along the width direction, the width direction is perpendicular to the height direction and the length direction; at least a part of the liquid distribution branch pipes are further distributed along the width direction, and at least a part of the liquid collection branch pipes are further distributed along the width direction.

5. The liquid cooling system according to claim 4, wherein the second plane is located above the first plane.

6. The liquid cooling system according to claim 5, wherein the liquid supply port and the liquid return port are located in a third plane perpendicular to the height direction, the third plane is located between the first plane and the second plane or at the same level as the first plane.

7. The liquid cooling system according to claim 6, wherein each of the heating units extends along the width direction; the liquid inlet and the liquid outlet of the cooling flow channel are located at an end of the heating unit along the width direction; the heating units are arranged along the width direction to form two rows of heating assemblies, each row of heating assemblies is formed by a plurality of heating clusters arranged along the length direction, and each heating cluster is formed by a plurality of heating units arranged along the height direction; the liquid inlet and the liquid outlet of each heating unit in each row of heating assemblies have an extension direction opposite to that of the liquid inlet and the liquid outlet of each heating unit in the other row of heating assemblies; the liquid distribution branch pipes and the heating clusters are arranged in a one-to-one correspondence, the liquid collection branch pipes and the heating clusters are arranged in a one-to-one correspondence.

8. The liquid cooling system according to claim 7, wherein
the liquid return pipe comprises a first connection segment extending along the length direction, a second connection segment extending along the height direction, and a third connection segment; one end of the first connection segment intersects with the fifth segment at the total liquid collection end, and the other end communicates with the top end of the second connection segment; the bottom end of the second connection segment communicates with the third connection segment; the other end of the third connection segment communicates with the liquid return port; the first connection segment is provided with an exhaust valve away from the total liquid collection end.

9. The liquid cooling system according to claim 8, wherein the liquid distribution branch pipe and the liquid collection branch pipe are located on two sides of a corresponding heating cluster along the length direction, respectively.

10. An energy storage system using a liquid cooling system for cooling a plurality of heating units each having an identical cooling flow channel provided with a liquid inlet and a liquid outlet; wherein the liquid cooling system comprises:
a cooling liquid circulating supply device provided with a liquid supply port and a liquid return port; and
a pipeline system including a liquid supply pipe, a liquid return pipe, and a flow distribution subsystem; one end of the liquid supply pipe communicates with the liquid supply port, and the other end is connected to the flow distribution subsystem at a total flow distribution end; one end of the liquid return pipe communicates with the liquid return port, and the other end is connected to the flow distribution subsystem at a total liquid collection end; the flow distribution subsystem connects the total flow distribution end and the liquid inlet of each heating unit and connects the total liquid collection end and the liquid outlet of each heating unit; in the flow distribution subsystem, the plurality of heating units have the same liquid passage length; the liquid passage length of the heating unit is equal to the sum of the length of pipeline between the liquid inlet of the heating unit and the total flow distribution end and the length of pipeline between the liquid outlet of the heating unit and the total liquid collection end;
wherein the cooling liquid circulating supply device is located on one side of the pipeline system along a length direction; the total flow distribution end and the total liquid collection end are respectively located at two ends of the pipeline system along the length direction;
the flow distribution subsystem comprises a first pipeline connecting the liquid inlet of each heating unit and the total flow distribution end, and a second pipeline connecting the liquid outlet of each heating unit and the total liquid collection end; the first pipeline comprises a liquid distribution pipe located in the first plane, liquid distribution branch pipes extending along a height direction perpendicular to the first plane, and liquid inlet pipes; the second pipeline comprises a liquid collection pipe located in the second plane, liquid collection branch pipes extending along the height direction, and liquid outlet pipes;
the liquid distribution pipe consists of a first segment, a second segment, and a third segment; the first segment and the third segment are parallel to each other and both extend in the length direction, the liquid distribution branch pipes are connected, in parallel, to the first segment and the third segment; the second segment extends along a width direction, two ends of the second segment respectively communicates with the first segment and the third segment, and the second segment intersects with the liquid supply pipe at the total flow distribution end;
the liquid collection pipe consists of a fourth segment, a fifth segment, and a sixth segment; the fourth segment and the sixth segment are parallel to each other and both extend in the length direction, the liquid collection branch pipes are connected, in parallel, on the fourth segment and the sixth segment; the fifth segment extends along the width direction, two ends of the fifth segment respectively communicates with the fourth segment and the sixth segment, and the fifth segment intersects with the liquid return pipe at the total liquid collection end.

* * * * *